United States Patent [19]
Meola et al.

[11] Patent Number: 5,910,354
[45] Date of Patent: Jun. 8, 1999

[54] METALLURGICAL INTERCONNECT COMPOSITE

[75] Inventors: Carmine G. Meola, Elkton, Md.;
Daniel D. Johnson, Yorklyn, Del.;
Donald R. Banks, Eau Claire, Wis.;
Joseph G. Ameen, Newark, Del.

[73] Assignee: W. L. Gore & Associates, Inc., Newark, Del.

[21] Appl. No.: 08/810,846

[22] Filed: Mar. 4, 1997

[51] Int. Cl.[6] ............................... B32B 27/14; H05K 1/00
[52] U.S. Cl. ...................... 428/198; 428/308.4; 428/422; 428/901; 174/258; 174/262; 174/263; 439/83; 257/779; 427/96; 228/180.21
[58] Field of Search ..................................... 174/265, 258, 174/262, 263; 428/209, 901, 36.5, 304.4, 198, 308.4, 422; 257/779; 439/83; 427/96; 228/186.21

[56] References Cited

U.S. PATENT DOCUMENTS

| | | | |
|---|---|---|---|
| 3,541,222 | 11/1970 | Parks et al. | 174/261 |
| 3,953,566 | 4/1976 | Gore | 264/288 |
| 5,498,467 | 3/1996 | Meola | 428/198 |
| 5,576,519 | 11/1996 | Swamy | 174/265 |

OTHER PUBLICATIONS

Pending U.S. application No. 08/724,393, entitled "A Reusable, Selectively Conductive, Z–Axis, Elastomeric Composite Substrate", Meola et al., filed Oct. 1, 1996.

Pending U.S. application No. 08/752,496, entitled "Interconnected Multi–Layer Circuit Board," Suilmann et al., filed Nov. 8, 1996.

*Primary Examiner*—William Krynski
*Assistant Examiner*—Cathy F. Lam
*Attorney, Agent, or Firm*—Victor M. Genco, Jr.

[57] ABSTRACT

A metallurgical interconnect composite is provided defined by a compliant, metallurgical, open cell, porous substrate which has a plurality of Z-axis conductive pathways extending from one side of the substrate to the other side. Each conductive pathway terminates in a solder covered surface area.

25 Claims, 11 Drawing Sheets

METALLURGICAL INTERCONNECT COMPOSITE

FIELD OF THE INVENTION

The present invention relates to a high density, selectively conductive, metallurgical interconnect composite substrate, its use and method of manufacture. More specifically, the present invention relates to a compliant, metallurgical open cell porous substrate, having a plurality of conductive pathways extending from one side of the substrate to the other side, each of which terminates in a solderable surface area. Typically, the pathways are irregular in shape. The pathways are electrically conductive in a Z-axis direction and are electrically isolated from one another in the X and Y axes, thus providing a selectively conductive metallurgical interconnect composite.

BACKGROUND OF THE INVENTION

A goal of the electronics industry is to provide reliable electrical connections between electronic circuit components, while compensating for dimensional irregularities arising from the manufacture of those components or subcomponent assemblies. For example, conductive pads on electronic components or metal traces on circuit boards do not always lie in the same plane, thus creating non-uniform spacing between mated components and incomplete electrical connection.

Current electrical connection technology uses a solder attachment process (BGA, microBGA, C-4) to make electrical interconnects from integrated circuit (IC) packages to printed wiring boards, and an underfill material that flows and fills the spaces between the solder interconnects. The underfill material acts to hold the board and package in compression. Underfilled assemblies are capable of surviving thermal aging, heat and humidity aging or pressure pot testing. However, current underfill materials are expensive and have long cure times. They require freezer storage, have short working times, and do not consistently and reliably fill 100% of the void spaces under a chip, which often occurs through capillary action to flow and fill.

Existing metallurgical interconnect components involve placing solder balls or bumps on conductive pads of one electrical component, for connection to another electrical component, such as, chips to circuit boards, circuit boards to circuit boards, multichip modules to circuit boards or terminals to terminal connectors. Unfortunately, a very large number of solder bump connections are required, since one bump is required for each contact point or bonding pad on each die. As is known in the art, solder bump interconnections are susceptible to thermal stress cracking and are a significant source of failure.

A disadvantage of the existing solder bump methodology is that it requires the presence of metal, i.e., the solder, above active circuitry, thus slowing electrical signal propagation. Further, existing solder bump technology requires relatively large attachment sites and cannot be inspected after reflow of the solder.

Another disadvantage with existing solder bump techniques is that shadow masks are required. The masks, which are often made of molybdenum, are expensive and must be replaced periodically. After each use, the masks must be cleaned to remove solder from the mask. A disadvantage of this process is the high overall cost of the process. Also, the quality and reuse of the solder alloy is not acceptable and masks get coated with the solder materials and must be continuously cleaned or replaced.

Another problem with existing bump technology is that the height of the solder bump creates a very narrow gap between the semiconductor chip and the substrate, approaching less than 50 microns, which cannot be adequately underfilled by using existing underfill techniques.

In an attempt to overcome some of these disadvantages, an interconnect sheet has been proposed in U.S. Pat. No. 5,576,519 to Swamy. There, a polymeric sheet is predrilled to form openings which are filled with solder paste and reflowed to form solid solder columns. As such, the compliancy of the interconnect sheet is not extended to the solder columns since they are solid in design.

Thus, a need exists for a compliant material that can provide uniform quantities of solder for connecting electronic components while providing a compliant substrate that compensates for irregularities in surface geometry, such as that caused by the lack of planarity in the conductive pads or metal circuit traces.

SUMMARY OF THE INVENTION

This invention relates to a compliant, selectively conductive composite substrate that has a solderable surface to reliably and electrically connect electronic components, and to methods for its manufacture.

One aspect of the present invention is to provide a low modulus porous polytetrafluoroethylene (PTFE) metallurgical interconnect to decouple the stress induced by the coefficient of thermal expansion (CTE) mismatch between two electrical components, e.g., an integrated circuit (IC) element and a printed wiring board (PWB).

Another aspect of the present invention is to provide a metallurgical interconnect material that can eliminate the use of underfill and the shortcomings associated with underfill processes.

Another aspect of the present invention is to provide a compliant metallurgical interconnect sheet and a method of its manufacture.

Yet another aspect of the present invention is to provide a polymeric sheet having discrete surface areas that are solder coated.

Yet another aspect of the present invention is to provide a complaint, selectively conductive material with a solder layer which is disposed on an exposed surface of the conductive layer material.

These and other objects will become more apparent when considered in conjunction with the following detailed description, non-limiting examples, drawings and appended claims.

DETAILED DESCRIPTION OF THE INVENTION

Figure 1:
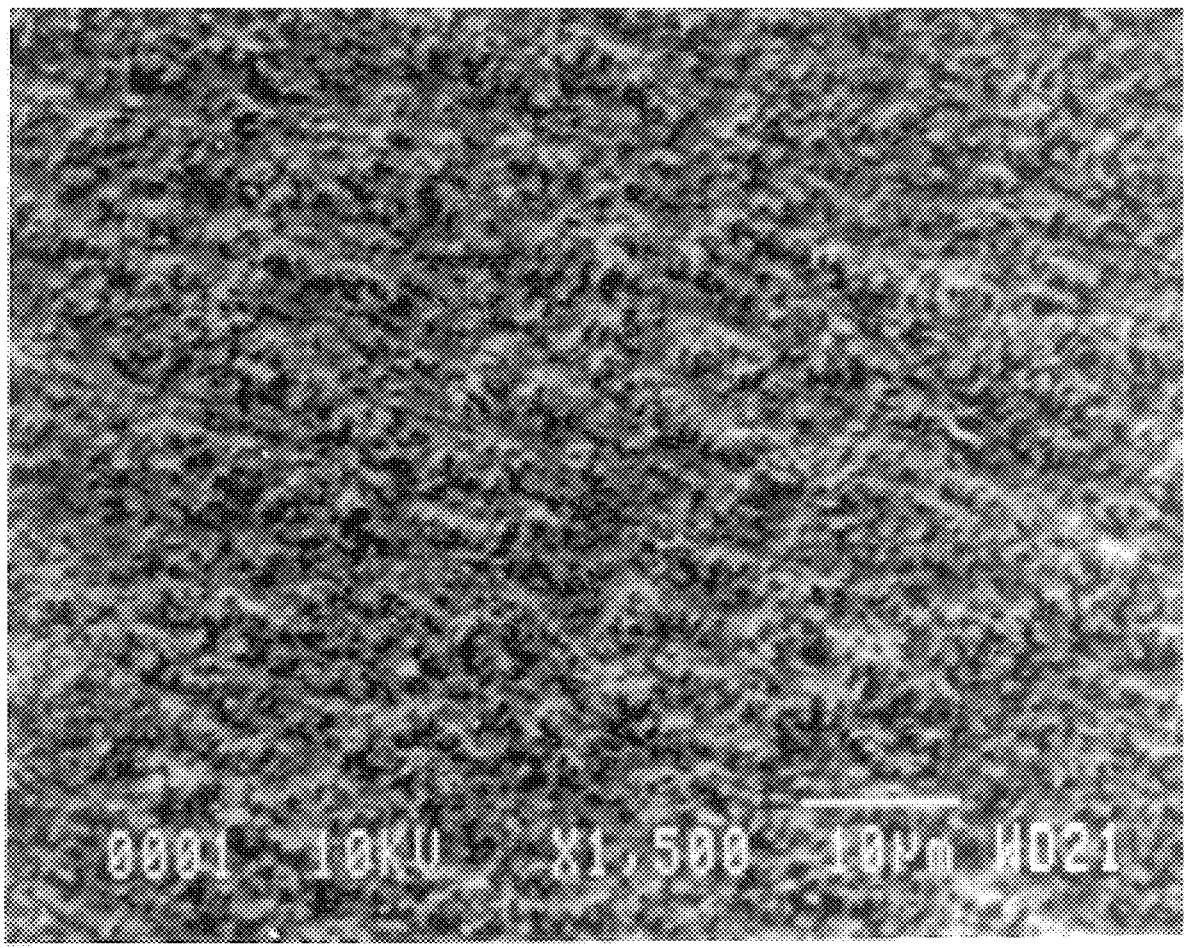
FIG. 1 is scanning electromicrograph (SEM) of a preferred polymeric substrate for use in the present invention.

The metallurgical interconnect composite of the present invention is made from a planar, open cell, porous material which has been selectively treated in a manner such that a plurality of conductive paths extend through the thickness of the material, in the Z-axis direction, from one side of the material to the other. These conductive Z-axis paths terminate in surface located conductive areas, which may define a variety of shapes. The porous, selectively conductive material is treated to form a layer of solder on the conductive areas, thereby forming a metallurgical interconnect composite. The compliant nature of the porous material is capable of relieving stress that arises from operating protocols. As such, the use of underfill to compensate for thermal stresses at the solder contact points is unnecessary. Because the solder contacts of the present invention are not in the form of solid columns, but instead are a skeletal metal conductive structure capped at its ends with at least a layer solder, there is greater compliancy in the metallurgical interconnect composite of the present invention. Also, the solder is an integral part of the composite matrix.

The metallurgical composite may be located between two electronic components to make electrical contact therebetween. While restrained in position, the metallurgical composite is heated to allow the solder to reflow, thereby metallurgically connecting the two electronic components to one another.

The substrate for the metallurgical interconnect composite is prepared in accordance with the teachings of U.S. Pat. No. 5,498,467, incorporated herein by reference. The planar, open cell, porous material used in the present invention may be any material having continuous porous paths from one side to the other. The porous planar material must have an internal morphology in which the material defining the pores forms a path through the Z-axis direction within a vertically defined cross section through the Z-axis plane. The Z-axis directed path may be irregular in shape.

Suitable planar, open cell, porous materials have a thickness on the order of $5\times10^{-6}$ m and $5\times10^{-3}$ m (5 and 5000 microns), and include woven or non-woven fabric, such as a nylon, glass fiber, polyester fabric, cotton, or the like. The material may also be a porous polymeric film or membrane, that is flexible, such as porous polyolefins, e.g., porous polyethylene, porous polypropylene, porous fluoropolymers, or open cell, porous polyurethanes.

Porous fluoropolymers include, but are not limited to, porous polytetrafluoroethylene (PTFE), porous expanded polytetrafluoroethylene (ePTFE), porous copolymers of polytetrafluoroethylene and polyesters or polystyrenes, copolymers of tetrafluoroethylene and fluorinated ethylenepropylene (FEP) or perfluoroalkoxy-tetrafluoroethylene (PFA) with a $C_1$–$C_4$ alkoxy group. Preferred porous materials include expanded polypropylene, porous polyethylene and porous polytetrafluoroethylene.

In one embodiment of the present invention, the material used to prepare the selectively conductive composite material of the present invention is expanded polytetrafluoroethylene having a microstructure of nodes inter-connected with fibrils, a void volume of about 20 to 90%, and prepared in accordance with the teachings of U.S. Pat. No. 3,953,566

The planar porous material will generally have a thickness of between about 5 and 5000 microns, preferably between about 5 and 125 microns, but thickness is not a critical factor so long as the ultra-violet light, or other type of requisite radiation which is used to form the Z-axis conductive paths, will penetrate the porous material. Suitable ePTFE membrane materials are exemplified by the membranes depicted in FIGS. 1 and 2.

Figure 2:
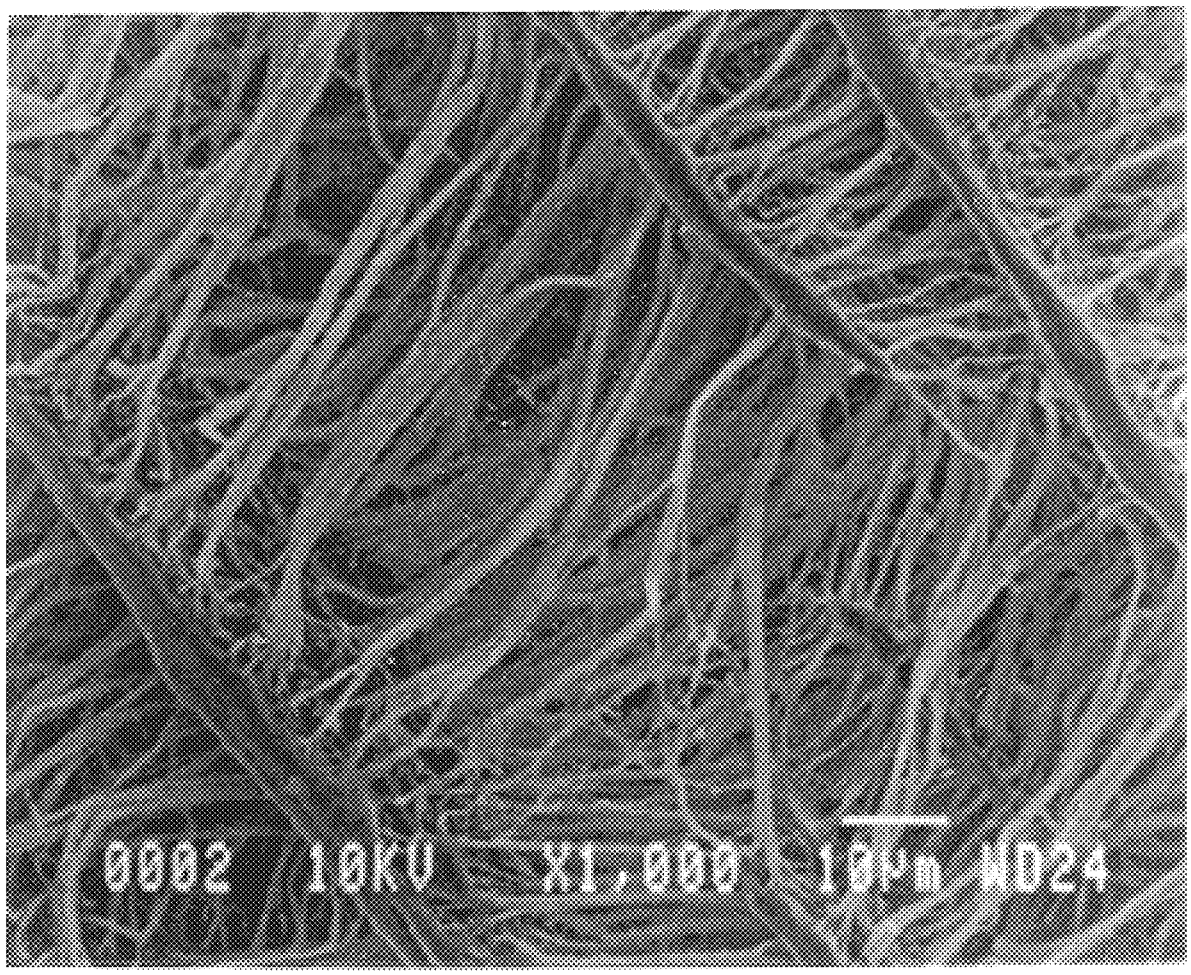
FIG. 2 is a scanning electromicrograph (SEM) of an alternative polymeric material for use in the present invention.

FIG. 1 is a scanning electromicrograph (SEM) of a 40 μm thick ePTFE membrane magnified 1500×, depicting the node-fibral infrastructure. This membrane has a density of about 0.4 gm/cm$^3$, an air volume of about 20% at 25° C., and is available from W. L. Gore & Associates, Inc. FIG. 2 is an SEM of a 150 μm thick ePTFE membrane, magnified 1500×, depicting the node-fibral infrastructure, with a density of about 0.20 gm/cm$^3$ and an air volume of about 70% at 25° C., and is also available from W. L. Gore & Associates, Inc.

The materials of FIGS. 1 and 2 are processed into selectively conductive materials, according to the techniques taught in the U.S. Pat. No. 5,498,467. Thus, the ePTFE materials of FIGS. 1 and 2 are saturated with a radiation sensitive composition to thoroughly wet the material defining the pores. The porous ePTFE material is subjected to a radiation sensitive composition for a time sufficient for the composition to permeate or penetrate through the pores of the material and form a coating on the pore interior, along the material defining the pores, from one side of the porous planar material to the other. Thereafter, the coated porous material is dried by air drying or oven baking, at a temperature below 80° C. At this stage, to preserve the light-sensitive nature of the treating compositions, the material should be processed under yellow light conditions. The material should also be kept at a temperature less than 70° F. and at no greater than 60% relative humidity because of possible excessive absorption of water by the material which can adversely affect the process.

A suitable radiation sensitive metal salt composition for saturating the material is a solution of a light sensitive reducing agent, a metal salt, a source of halide ions, and a second reducing agent. Typically, the radiation sensitive solution contains water, the metal salt, a light sensitive reducing agent, a second reducing agent, and optionally (for hard to wet surfaces) a surfactant.

The metal salt includes, but is not limited to, copper acetate, copper formate, copper bromide, copper sulfate, copper chloride, nickel chloride, nickel sulfate, nickel bromide, ferrous bearing compounds, such as, ferrous sulfate, ferrous chloride, and nobel metals such as palladium, platinum, silver, gold and rhodium.

Suitable light-sensitive reducing agents are aromatic diazo compounds, iron salts, e.g., ferrous or ferric oxalate, ferric ammonium sulfate, dichromates e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of from about 1 mg. to about 2 grams per liter.

The second reducing agents include, but are not limited to, polyhydroxy alcohols, such as glycerol, ethylene glycol, pentaerythritol, mesoerythritol, 1,3-propanediol, sorbitol, mannitol, propylene glycol, 1,2-butanediol, pinacol, sucrose, dextrin, and compounds such as triethanolamine, propylene oxide, polyethylene glycols, lactose, starch, ethylene oxide and gelatin. Compounds which are also useful as secondary reducing agents are aldehydes, such as formaldehyde, benzaldehyde, acetaldehyde, n-butyraldehyde, polyamides, such as nylon, albumin and gelatin; leuco bases of triphenyl methane dyes, such as 4-dimethylaminotriphenylmethane, 4',4',4"-tri-dimethylamino-triphenylmethane; leuco bases of xanthene dyes, such as 3,6-bis dimethylamino xanthene and 3,6-bis dimethylamino-9-(2-carboxyethyl) xanthene; polyethers, such as ethylene glycol diethyl ether, diethylene glycol, diethyl ether tetraethylene glycol dimethyl ether, and the like.

A second reducing agent that is also a humectant, exemplified by sorbitol, is generally preferred as a constituent of the treating solution. It provides substantial aid in maintaining density of the metal coating on the internal structure of the material during a developing step in which any unconverted radiation-sensitive composition in the coating is washed off of the base.

Among the suitable surfactants are polyethenoxy nonionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

The radiation sensitive composition contains an acidifying agent in the form of an acid salt for adjusting the pH of the aqueous solution to usually between about 2.0 and 4.0 (preferably 2.5 to 3.8) and a small quantity of halide ions (iodide, bromide or chloride ions), so that a combination of additives provides a surprising effect in substantially intensifying the density of the coating that is subsequently formed. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycerin, etc.) or by some additives for introducing halide ions (e.g., hydrochloric acid). Similarly, some or all of the halide ions may be introduced as components of the reducible metal salt (e.g., cupric chloride).

Among the many suitable acidic substances which may be employed in controlling or adjusting the pH of the sensitizing solution are fluoroboric acid, citric acid, lactic acid, phosphoric acid, sulfuric acid, acetic acid, formic acid, boric acid, hydrochloric acid, nitric acid and the like. A wide variety of bromide, chloride and iodide salts and other halide-generating water soluble compounds may be utilized to provide part or all of the desired halide ion content of the treating solution. These may include, inter alia, salts of metals in general and these halogens are exemplified by cupric bromide, nickel chloride, cobalt chloride, cupric chloride, sodium iodide, potassium iodide, lithium chloride, magnesium iodide, magnesium bromide, sodium bromide, potassium bromide, and the like. Bromide salts are preferred, as they produce a higher degree of sensitivity (i.e., darker and denser deposits) on the substrate than the corresponding chlorides in at least certain instances.

The halide ions constitute only a minor proportion of the solute and may typically range from about 0.045 to 1.6%, preferably about 0.13 to 0.45%, based on the total weight of the dissolved solids. The amount of halogen may be stated otherwise as being between about 0.9 and 25 milliequivalents of halogen per liter of the sensitizing solution, preferably about 2.5 to 9 milliequivalents, e.g., 0.3–1.0 gm/l for cupric bromide. Increasing the proportions of the halide ions is usually undesirable as such increase appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least 2:1 and preferably about 4:1 to 100:1.

In one embodiment, the ePTFE materials (membranes) of FIGS. 1 and 2 are treated with a wetting agent by immersing it in a solution of 75% methanol, 25% ethanol and of 1 weight % copolymer of tetrafluoroethylene and vinyl alcohol at room temperature for about 30 seconds. Thereafter, the wetted membranes are dipped in a catalytic treating solution prepared by adding the following components to one liter of D.I. water:

| COMPONENT | AMOUNT (gms) | |
| --- | --- | --- |
| 2,6 di-sodium anthraquinone di-sulfonic salt | 30 | |
| 2,7 di-sodium anthraquinone di-sulfonic salt | | 30 |
| sorbitol | 220 | 220 |
| cupric acetate | 15 | 15 |
| cupric bromide | 0.5 | 0.5 |
| olin G-10 surfactant | 2 | |
| fluoroboric acid | pH 3.5–3.8 | | for 60 seconds and then dried in an oven at 80° C. for a minimum of 20 minutes.

Figure 5:
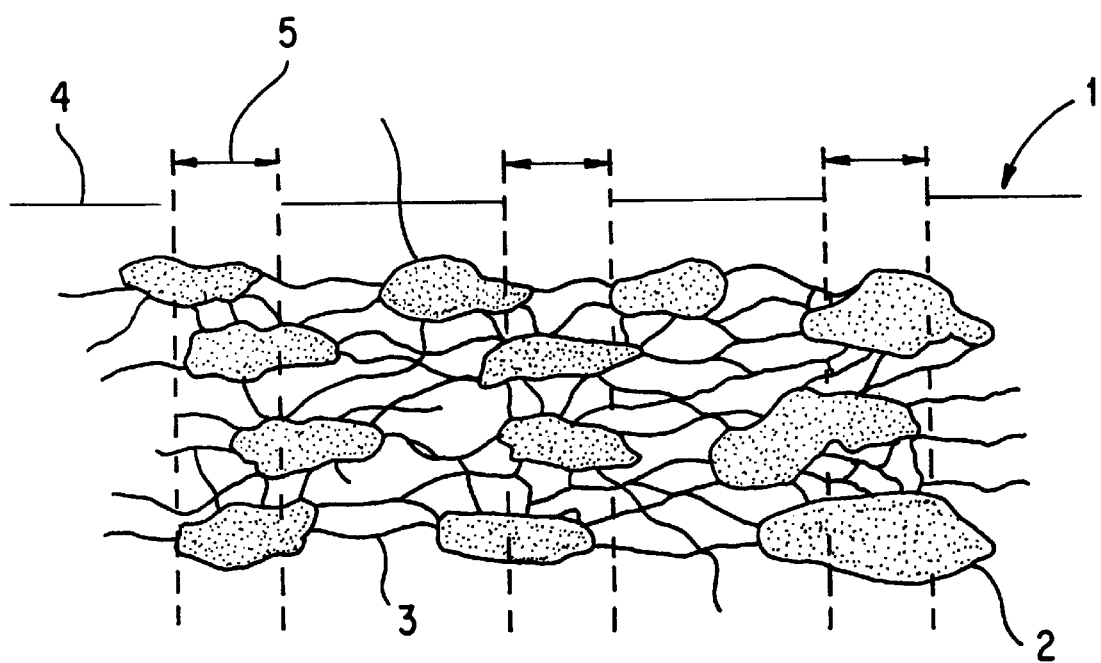
FIG. 5 is a cross-sectional view of an open cell, planar porous member showing designated areas for UV light exposure for forming conductive pathways in a Z-axis direction.

The dried ePTFE membranes are then selectively masked with a metallic mask, diazo or silver halide film. The masked materials are photo imaged with either a non-collimated or collimated ultraviolet light source of less than 500 manometers wavelength. The catalyst, the nonconductive metal nuclei, itself requires a minimum of 100 millijoules radiant energy to establish a stable photo image. As seen in FIG. 5, the ePTFE material used in this invention contains fibrils 2, nodes 3 and is covered by mask 4. Mask 4, the diazo or silver halide film, is developed to provide openings 5 through which UV light can pass.

Masking results in areas of any desired, shape, size, array or alternating bands or strips for forming conductive areas through the Z-axis direction, separated by alternating bands of nonconductive areas (electrically isolating). In one embodiment, masking provides dots which are conventionally circular, but which may have other geometrical configurations, such as squares, rectangles, strips, etc. The size of the dot can be as small as a 0.0001 inches and as large as 1 inch. Dots of 0.001 inches, 0.002 inches, 0.003 inches, 0.004 inches, 0.005 inches, 0.008 inches, 0.009 inches or fractions thereof can be formed. The pitch, defined as the distance between the centers of adjacent dots is at least twice the dimension of the dots, forming a dot:pitch ratio of at least 1:2; 1 mil dot:2 mil pitch; 2 mil dot:5 mil pitch; 8 mil dot:15 mil pitch, and so on. However other dot:pitch ratios are possible, so long as the spacing between adjacent conductive dots is sufficient to prevent shorting.

Figure 3:
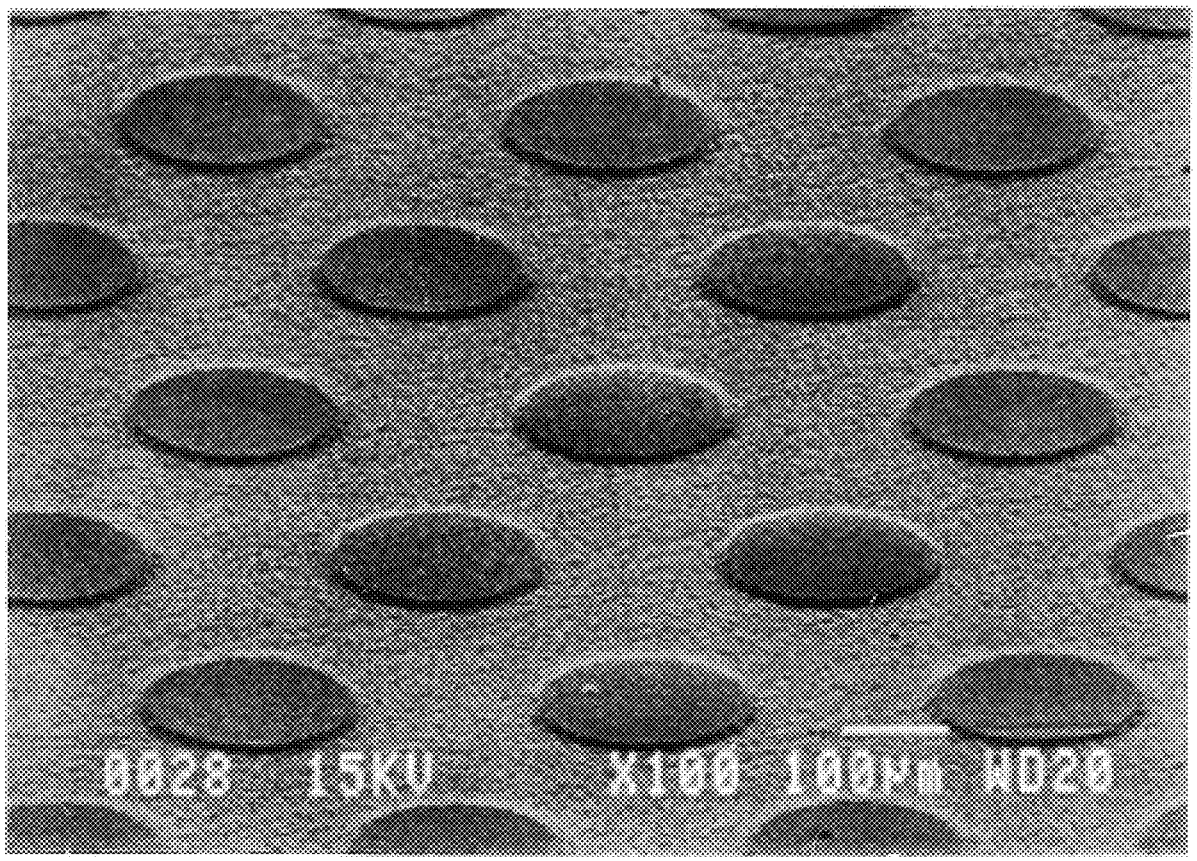
FIG. 3 is an SEM of a selectively conductive material having an array of 2 mil pads with a 5 mil pitch.
Figure 4:
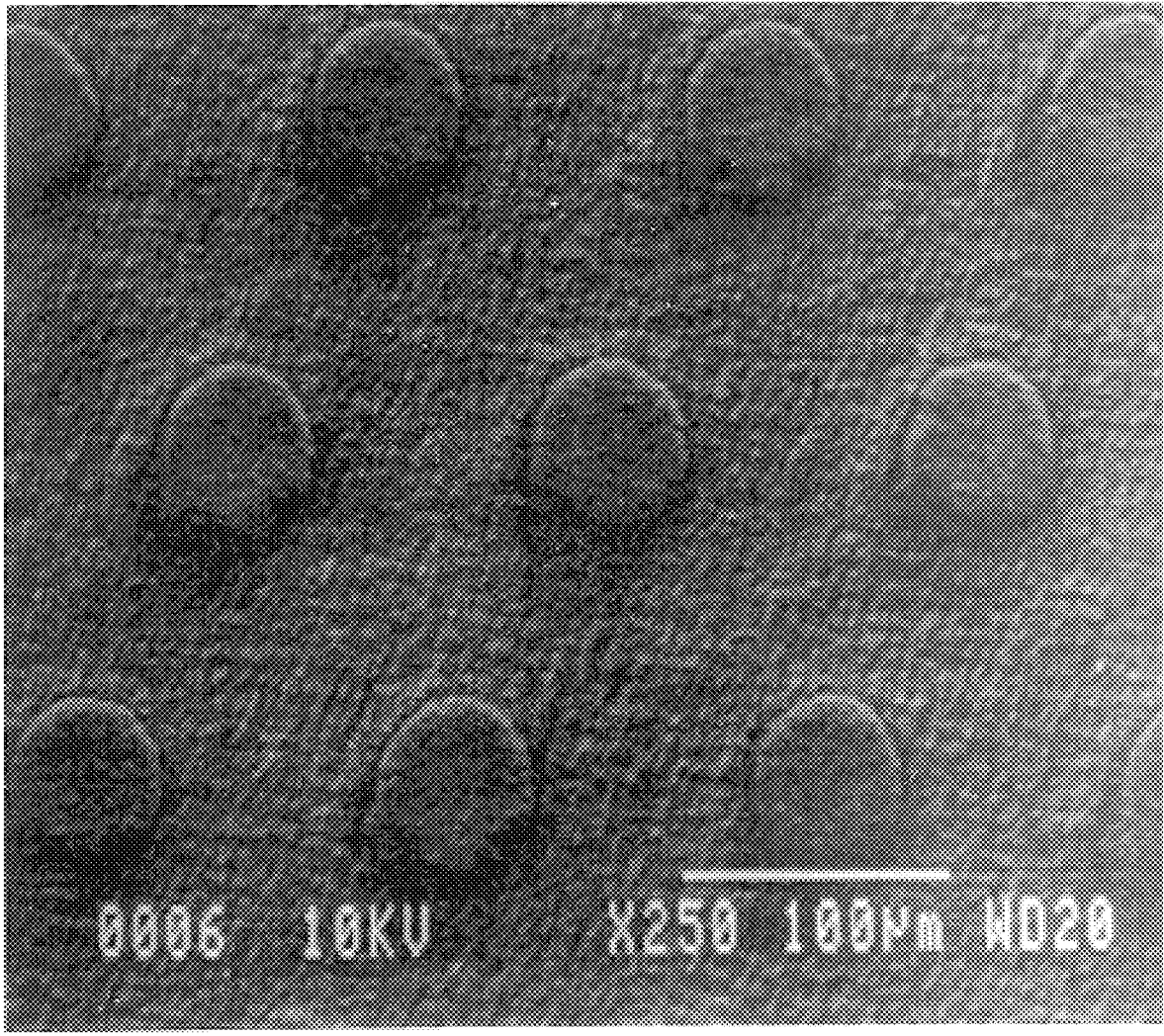
FIG. 4 is an SEM of a selectively conductive material having an array of 8 mil pads with a 15 mil pitch.

The ePTFE materials of FIGS. 1 and 2 are respectively masked with a diazo film 4 to form materials that will have a 2 mil diameter dot: 5 mil pitch array; 6 mil diameter dot: 6 mil pitch; and a 8 mil diameter dot:15 mil pitch. FIGS. 3 and 4 show the 2:5 and 8:15 dot pitch ratio array.

The masked material 4 is exposed to radiation, such as light, electron beams, x-ray, and the like, preferably ultraviolet radiation, for a time and at a power sufficient to reduce the metallic cations, in the metal salt, to metal nuclei throughout the thickness of the material. When UV light energy is used it is strong enough to penetrate through the thickness of the porous material. For example, the radiation containing composition and masked ePTFE materials of FIGS. 1 and 2 are irradiated with a collimated UV light source at 1600 millijoule for about 2 minutes.

The UV exposed material is unmasked and washed with an acidic or alkaline washing solution to wash off the radiation sensitive composition that had been protected by the opaque cover. The acidic or alkaline washing (or fixing) solution does not affect the areas where the radiation has reduced the metal cations to metal nuclei, if the solution is not left in contact with the areas for more than a few minutes, e.g., 5 minutes or less.

After a 5 minute normalization period, the catalyzed material is then washed for a short period of 30–90 seconds in a sulfuric acid solution, e.g. a solution consisting of 8% sulfuric acid by weight and 92% deionized water by weight or an alkaline solution consisting of 40 g/l of ethylene diamine tetraacetic acid, 100 ml/l of formaldehyde, adjusted at a pH of greater than 10 with sodium hydroxide. The purpose of this washing step is to eliminate the unexposed catalyst from the material while retaining the photo-reduced image.

The washed material containing the selective image is next stabilized with a reactive metal cation replacement solution. A convenient solution is:

| REACTIVE METAL CATION SOLUTION |
| --- |
| 0.25 gram/liter of palladium chloride |
| 8% sulfuric acid by weight |
| 92% D.I. water by weight |

A replacement reaction occurs replacing the coated copper with a more stable cation, e.g., palladium. A more stable system is desired because of the tendency of the copper to oxidize at such thin layer amounts and because of the ability of the palladium to initiate the reduction reaction in the electroless both more rapidly. The material is dipped into the stabilizing solution for about one minute and then is washed in distilled water for about one minute, and is subsequently washed in D.I. water for about 1 minute.

The catalyzed material is selectively electrolessly plated with one or more conductive metals to a deposition thickness of about 50 to about 300 micro inches. Such metals include copper, nickel, gold, silver, platinum, cobalt, palladium, rhodium, aluminum and chromium. During the time in the electrolyses baths, the material is agitated with a rocking motion to promote diffusion of the metal to the innermost region of the substrate. Plating is carried out by first rinsing in deionized water, then dipping in an agitated electroless copper bath for a time sufficient to deposit copper in the material over the palladium and through the substrate thickness, e.g., a copper plating bath composition (Shipleys 3) on a per liter of D.I. water basis,

| PLATING SOLUTION |
| --- |
| 30 grams of ethylenediamine tetra acetic acid |
| 6 to 8 grams sodium hydroxide |
| 5 to 7 grams copper II sulfate |
| 2 to 3 grams formaldehyde |
| 2 grams of a given surfactant |

The membrane was agitated in the bath using an agitation bar for about 30 minutes to promote diffusion of copper throughout the pores of the membrane in the catalyzed portion throughout the membrane or material.

Metallurgical Connect Composites

The material prepared above, having selectively conductive Z-axis paths terminating in conductive areas with a dot:pitch ratio of 2:5 and 8:15, are fixed on either a ring hoop device or other suitable mechanical fixture that prevents the shrinkage of the membrane during thermal stress. The supported material may then be fluxed with rosin or aqueous activated fluxes, e.g., alpha metal fluxes, using conventional techniques. If on the other hand, the conductive areas have a layer of gold thereon, fluxing does not have to be performed.

The material that has been treated with flux is left at room temperature for about a minute to allow excessive flux to drain off the surface. Alternatively, drying can be performed at moderate temperatures, e.g., 40° C., for several minutes, e.g., 2 minutes.

Solder Preparation

A solder applicator, e.g., a pot, wave solder, hot air leveler, etc., is maintained at a temperature of between 190° C. and 250° C. The solder to be applied to the selectively conductive composite substrate is placed in the heated soldering pot or leveler bath and melted. Suitable solders usable in the present invention include, tin/lead alloy solders, e.g., (Sn/Pb=63/37, 60/40, 50/50, 45/55, 40/60, 30/70, 25/75, 15/85, 10/90, 5/95, 3/97); silver bearing solders, e.g. (Sn/Ag=96.5/3.5, 95/5; and Sb/Pb/Ag=62/36/2, 10/88/2, 5/92.5/2.5, and 1/97.5/1.5), 100 Sn, 95 Sn/s Sb, 99 Sn/1 Sb, 43 Sn/43 Pb/14 Bi, and lead free solders such as, 96.5 Sn/3.5 Ag, 90 Sn/7.5 Bi/2 Ag/0.5 Cu, 95 Sn/3.5 Ag/1.5 On, and 42 Sn/58 Bi. The dross is removed from the top of the solder pot.

The fixtured compliant, selectively conductive composite substrate is inserted into the solder bath at an angle, no greater than 20°, preferably less than 15°, such as 9°, 8°, 7°, 6°, 5° or 4° degrees relative to a horizontal plane. The frame and material are left in the solder pot for several seconds, e.g., not more than 5 to 10 seconds. The mounted membrane is preferably removed from the solder bath at the angle of insertion. The frame and solder covered membrane are allowed to cool. If the membrane was fluxed prior to insertion into the solder pot, it is washed in an appropriate solder residue removing solvent, such as, 2-propanol, MEK, acetone, water, etc., for several minutes, e.g., 5 minutes or a time sufficient to wash the residue off the membrane at room temperature. The mounted membrane covered with solder is dried at about 60° C. until dry.

Figure 6:
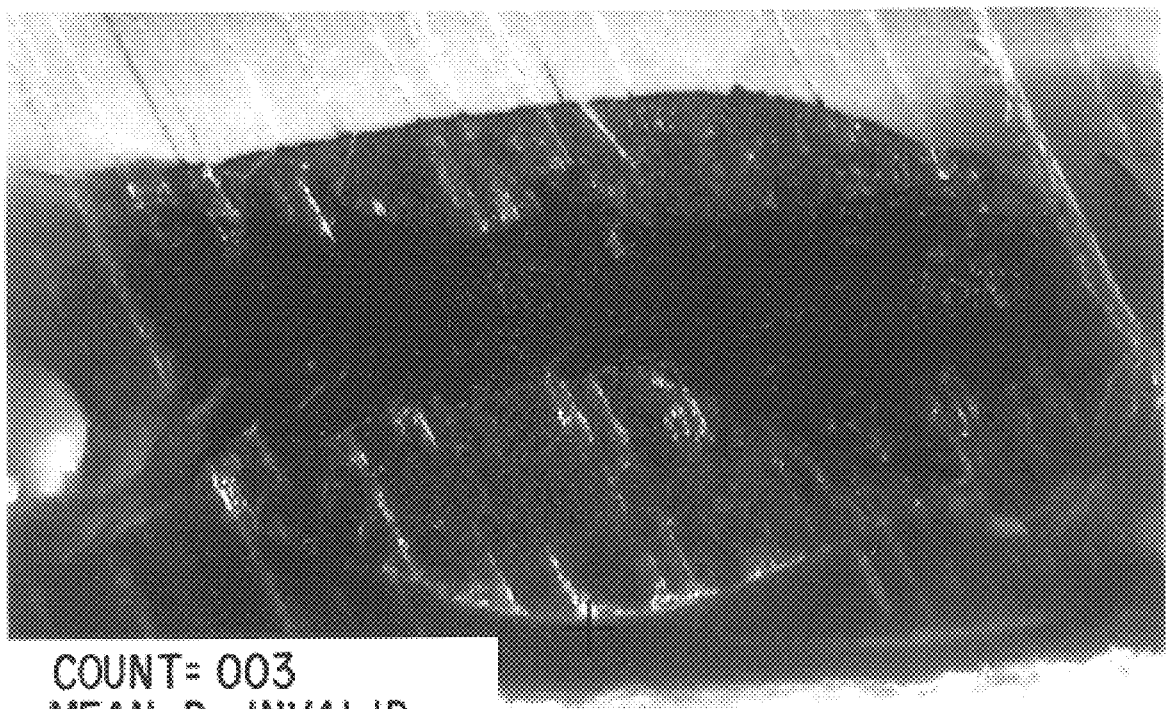
FIG. 6 is an SEM showing a cross-section of a planar, selectively conductive material containing a solder coated area.

As a result of the above procedure, the compliant selectively conductive composite material is formed with a layer of solder on upper and lower conductive areas of the material, as shown in FIG. 6. FIG. 6 is an SEM of a cross-section of the ePTFE material of FIG. 1 that has been processed to contain irregularly shaped, selectively conductive Z-axis directed conductive paths with a layer of solder. As seen in FIG. 6, the bottom solder layer is approximately 7.41 microns thick. The layer of solder is limited to the exposed surface conductive pad. The solder is prevented from penetrating any substantial distance into the porous membrane because of the solder's surface tension and the pore size of the membrane.

Figure 9:
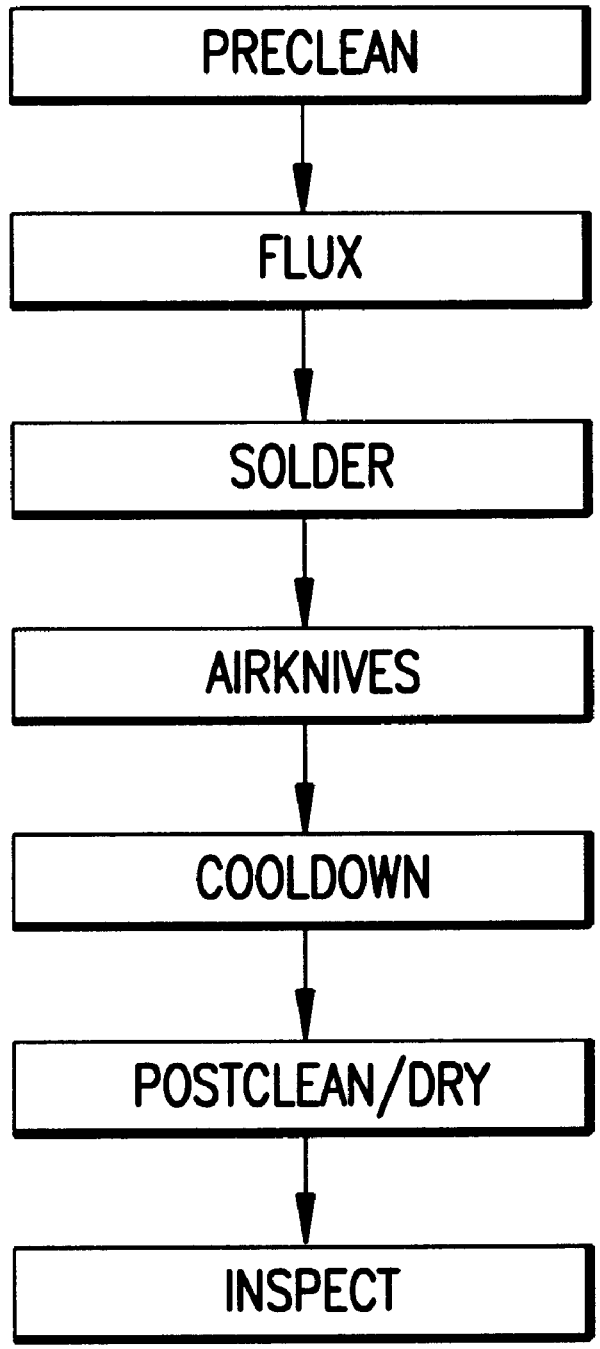
FIG. 9 is a schematic flow chart of the process for forming solder contacts according to the present invention.

In another embodiment of the present invention, a selectively conductive composite material prepared in accordance with this invention is mounted in a supporting frame as described above and processed according to the flowchart of FIG. 9. As seen from the flowchart, the mounted, selectively conductive composite material is pre-cleaned and fluxed using materials similar to that described hereinabove, and is inserted into a solder bath at an angle of less than 20°. Once the mounted material is pre-cleaned and fluxed, it is fed through an air level bath such as that shown in FIG. 10.

Figure 10:
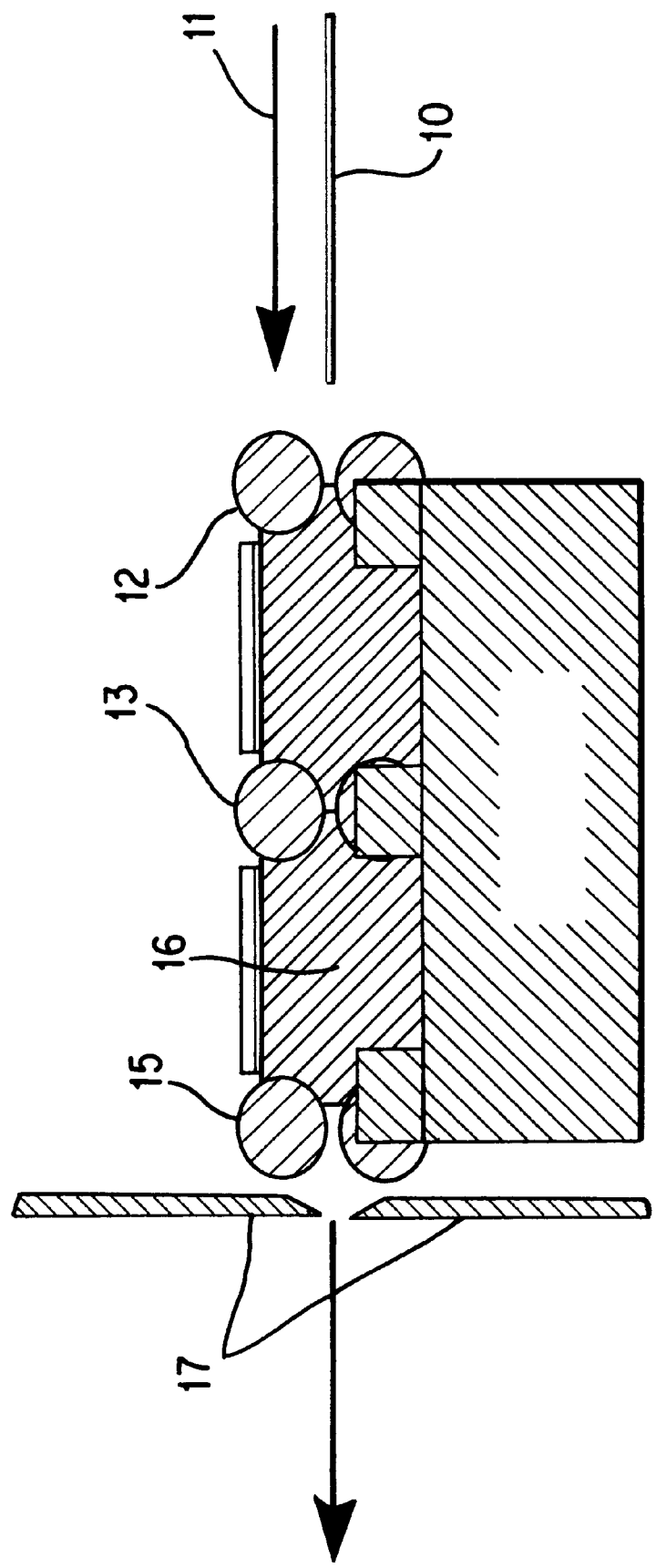
FIG. 10 shows a coating device used for forming the solder contacts in an alternate embodiment of the present invention.

As seen in FIG. 10, the mounted, compliant, selectively conductive composite material 10 is directed along arrow 11 to a first pair of rollers 12 at a maximum feed rate of about 30 ft/min. Solder is maintained in the bath defined by rollers 12, 13 and and side panels that are not shown. Rollers 12, 13 and 15 are commercially available, spring tensioned rollers that are usually 2 to 3 feet in width. Thus, materials supported on frames up to about 3 feet in width can be processed with such equipment. The solder 16, such as that described above, in a molten form and at a temperature between 185° F. and 220° F., is coated onto the mounted material 10. Thereafter, the material 10 is passed through air knives 17 which uniformly apply the solder to the upper and lower surfaces of mounted material 110. Thereafter, the ePTFE mounted material 10 with solder is subjected to a cool down process, is post cleaned, dried and inspected.

Figure 7:
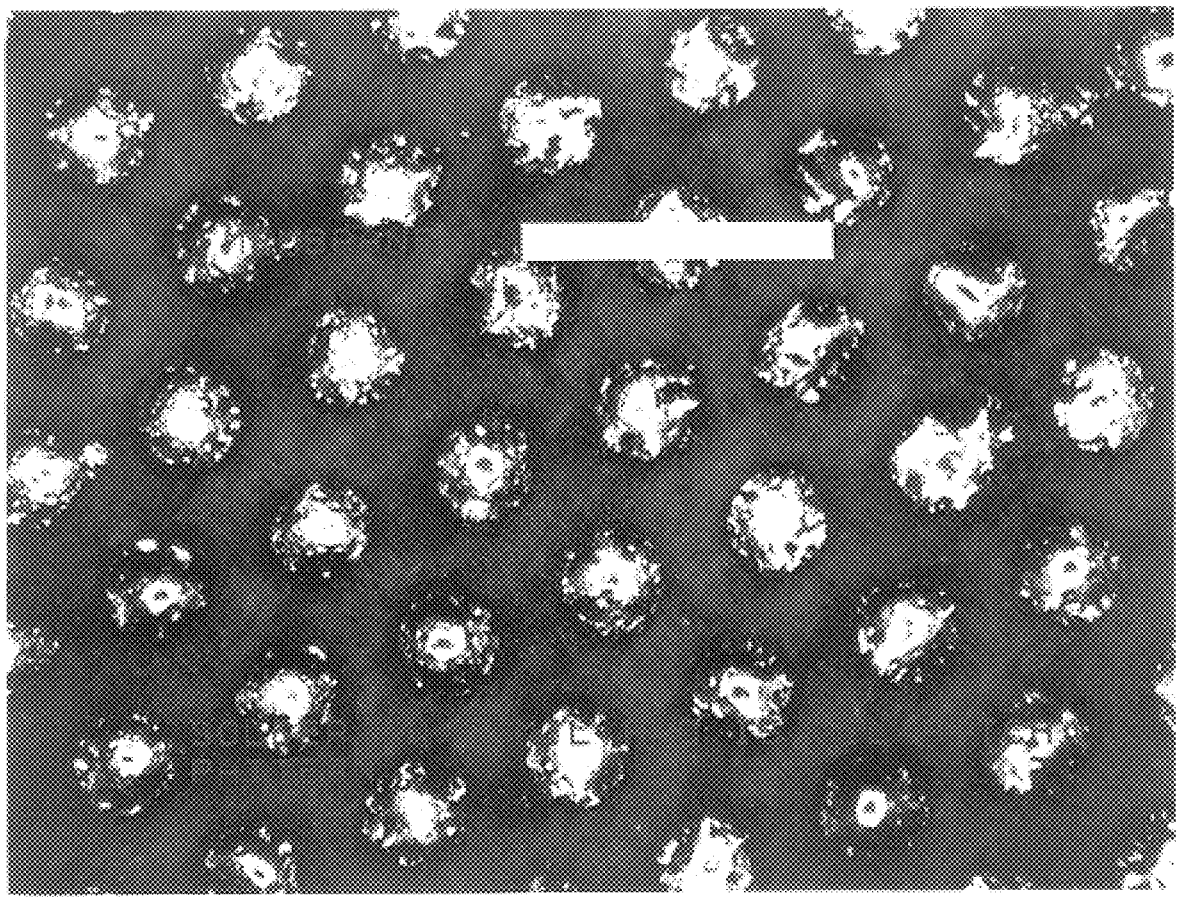
FIGS. 7 & 8 are SEMs showing plan views of discrete solder contacts prepared according to the present invention.
Figure 8:
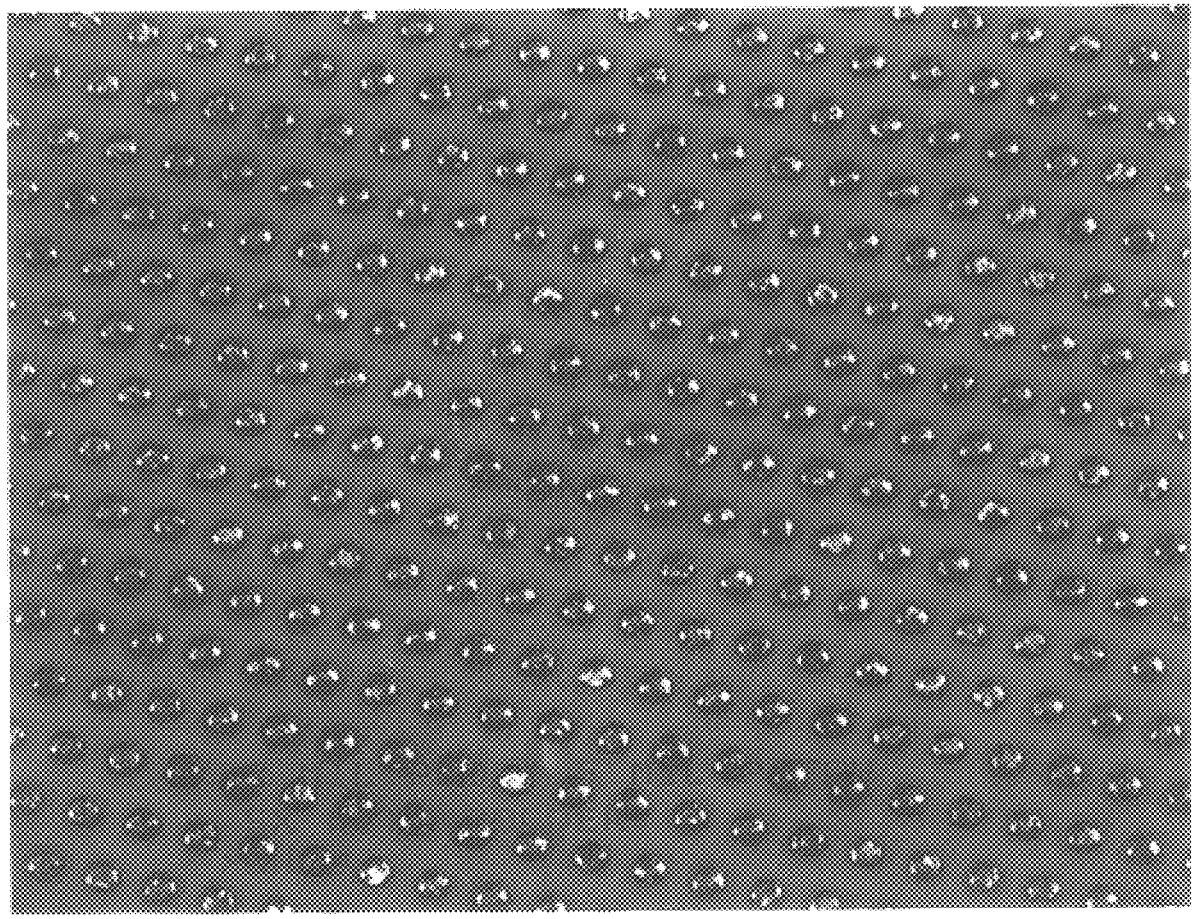

The resulting material 10 is best seen in FIGS. 7 and 8. FIG. 7 depicts an SEM of the material of FIG. 2 containing 8 mil solder areas with a 15 mil pitch pattern. FIG. 8 is an SEM of the material of FIG. 2 that has been processed in a similar manner using the device of FIG. 10 and the flowchart of FIG. 9, and contains 2 mil solder areas with a 5 mil pitch.

Figure 11:
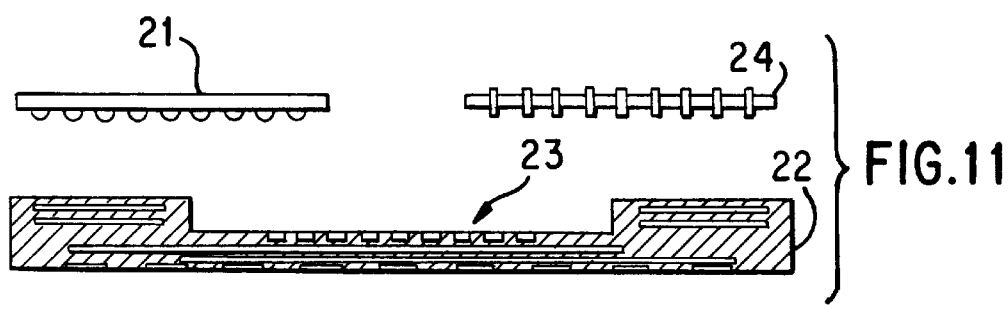
FIG. 11 depicts a use of the selectively conductive interconnect material according to the present invention.

The procedure for mounting a chip 21 on a substrate 22 containing a circuit element 23 is illustrated in FIG. 11. In FIG. 1, the compliant selectively conductive composite material 24, containing solder areas, is placed on the upper surface of the circuit element 23 without any particular orientation. Of course, should one desire to particularly align the composite material 24 on circuit element 23, well known techniques to those of ordinary skill in the art may be used for aligning the two members. After the composite material 24 is mounted on the circuit element 23, the chip 21 is aligned with the circuit element 23 and pressure is applied to chip 21 to maintain contact between the bumps on chip 21 and the metal traces or paths on circuit element 23.

Figure 12:
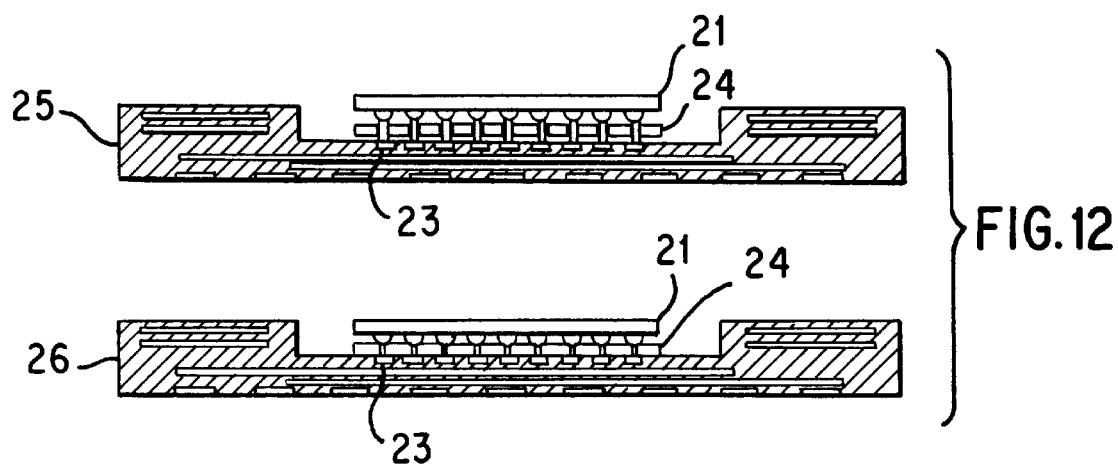
FIG. 12 depicts an electronic circuit component electrically connected to an object of interest using the metallurgical interconnect of the present invention.

The structure 25 of FIG. 12 is subjected to heat to reflow the solder located on the solder containing areas of the compliant, selectively conductive composite material 24. This results, after cooling, in a structure 26 having a metallurgical connection between chip 21 and circuit element 23 via the compliant, selectively conductive composite material 24. As a result of the compliant nature of the material 24, any lack of planarity that may exist between the pads or trace circuits in circuit element 23, or the bumps on chip 21, is compensated for by the compliant property of material 24.

Although the invention has been described in conjunction with the specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. A metallurgical interconnect composite comprising:
   an open cell, porous material having an x, y and z-axis, and within selected areas through said porous material, in the z-axis direction, said material is coated with a conductive metal so as to form a continuous path of conductivity through said selected areas, said path of conductivity terminating in solder coated areas on opposite surfaces of said porous material, said solder coated areas operable to form a metallurgical bond with an electronic component.

2. The invention according to claim 1, wherein said porous material is a polymer.

3. The invention according to claim 2, wherein said polymer is a polyolefin.

4. The invention according to claim 2, wherein said polymer is a fluoropolymer.

5. The invention according to claim 3, wherein said polyolefin is porous polypropylene or porous polyethylene.

6. The invention according to claim 4, wherein said fluoropolymer is porous polytetrafluoroethylene (PTFE).

7. The invention according to claim 4, wherein said fluoropolymer is porous, expanded polytetrafluoroethylene.

8. The invention according to claim 4, wherein said fluoropolymer is a porous copolymer of polytetrafluoroethylene.

9. The invention according to claim 1, wherein said conductive pathways are comprised at least in part of copper.

10. The invention according to claim 1, wherein said solder coated areas have a diameter d and have a pitch p, which is the center to center distance between adjacent solder coated areas, such that p is at least equal to 2 d.

11. The invention according to claim 1, wherein said conductive pathways are comprised at least in part of nickel.

12. The invention according to claim 1, wherein said conductive pathways are comprised at least in part of silver or gold.

13. A method of preparing a metallurgical composite comprising:
   a) providing a planar, open cell, porous material having conductive Z-axis pathways terminating in conductive areas; and
   b) forming a solder coating on said conductive areas.

14. The method according to claim 13, wherein said planar, open cell, porous material is a porous fluoropolymer.

15. The method according to claim 14, wherein said porous fluoropolymer is polytetrafluoroethylene.

16. The method according to claim 15, wherein said polytetrafluoroethylene is expanded polytetrafluoroethylene.

17. An electronic package comprising:
   at least first and second electronic components, said package further including an open cell, porous material having a plurality of z-axis directed, and x, y axes isolated pathways coated with a conductive metal and terminating in solder coated areas on opposite surfaces of said open cell, porous material, said open cell porous material metallurgically bonding said first and second electronic components.

18. The electronic package according to claim 17, wherein said porous material is a polymer.

19. The electronic package according to claim 18, wherein said polymer is a polyolefin.

20. The electronic package according to claim 18, wherein said polymer is a fluoropolymer.

21. The electronic package according to claim 19, wherein said polyolefin is porous polypropylene or porous polyethylene.

22. The electronic package according to claim 20, wherein said fluoropolymer is porous polytetrafluoroethylene (PTFE).

23. The electronic package according to claim 22, wherein said porous PTFE is porous expanded polytetrafluoroethylene.

24. An article comprising:

an electronic component; and a composite having an open cell, porous material having an x, y z-axis, and within selected areas through said porous material, in the z-axis direction, said material is coated with a conductive metal so as to form a continuous path of conductivity through said selected areas, wherein said electronic component is electrically connected to said composite at said selected areas by a metallurgical solder bond.

25. An article comprising:

an electronic component;

a composite having an open cell porous material having an x, y, and z-axis, and within selected areas through said porous material, in the z-axis direction, said material is coated with a conductive metal so as to form a continuous path of conductivity through said selected areas, said composite having opposed first and second surfaces; and a substrate containing a circuit element;

wherein said electronic component and said substrate are electrically connected to said first and second surfaces of said composite at said selected areas by a metallurgical solder bond.

\* \* \* \* \*

UNITED STATES PATENT AND TRADEMARK OFFICE
CERTIFICATE OF CORRRECTION

PATENT NO. : 5,910,354
DATED : June 8, 1999
INVENTOR(S) : Carmine G. Meola, et al.

It is certified that error appears in the above-identified patent and that said Letters Patent is hereby corrected as shown below:

Title page, item [56], add the followings:

U. S. PATENT DOCUMENTS

| EXAMINER INITIAL | PATENT NUMBER | ISSUE DATE | PATENTEE | CLASS | SUBCLASS | FILING DATE IF APPROPRIATE |
|---|---|---|---|---|---|---|
|  | 5 3 7 1 4 0 4 | 12/06/94 | Juskey et al. |  |  |  |
|  |  |  |  |  |  |  |

FOREIGN PATENT OR PUBLISHED FOREIGN PATENT APPLICATION

|  | DOCUMENT NUMBER | PUBLICATION DATE | COUNTRY OR PATENT OFFICE | CLASS | SUBCLASS | TRANSLATION YES | TRANSLATION NO |
|---|---|---|---|---|---|---|---|
|  | 0 7 2 6 6 2 1 | 08/14/96 | EPO |  |  |  |  |
|  | 0 3 2 8 3 2 5 | 08/16/89 | EPO |  |  |  |  |
|  | 0 2 1 3 7 7 4 | 03/11/87 | EPO |  |  |  |  |
|  | 0 3 6 8 2 6 2 | 05/16/90 | EPO |  |  |  |  |

Signed and Sealed this

Nineteenth Day of October, 1999

*Attest:*

Q. TODD DICKINSON

*Attesting Officer*   *Acting Commissioner of Patents and Trademarks*